United States Patent [15] 3,701,142
Cannara [45] Oct. 24, 1972

[54] INTEGRATING CONVERTERS WITH SYNCHRONOUS STARTING

[72] Inventor: Alexander B. Cannara, Denville, N.J.

[73] Assignee: Ballantine Laboratories, Inc.

[22] Filed: March 30, 1970

[21] Appl. No.: 23,668

[52] U.S. Cl.........340/347 NT, 340/347 AD, 307/269
[51] Int. Cl..........................H03k 19/28, H03k 13/20
[58] Field of Search....340/347 AD, 347 NT; 328/41, 328/49, 63; 307/247, 293, 269; 235/183

[56] References Cited

UNITED STATES PATENTS

| | | | |
|---|---|---|---|
| 3,510,784 | 5/1970 | Weber | 307/269 X |
| 3,051,939 | 8/1962 | Gilbert | 340/347 NT |
| 3,480,949 | 11/1969 | Charbonnier et al. | 340/347 NT |
| 3,368,149 | 2/1968 | Wasserman | 340/347 NT |
| 3,500,384 | 3/1970 | Naydan et al. | 340/347 NT |
| 3,316,547 | 4/1967 | Ammann | 340/347 AD |
| 3,504,200 | 3/1970 | Avellar | 307/269 |
| 3,508,254 | 4/1970 | Ross et al. | 340/347 AD |

*Primary Examiner*—Thomas A. Robinson
*Attorney*—Marshall J. Breen and Chester A. Williams, Jr.

[57] ABSTRACT

A circuit provides a reset and start pulse synchronized with a clock pulse for accurate starting and timing of the integrating process in a conventional dual-slope converter. A cycle flip-flop is randomly set to a logical one state to enable a gate to pass the next inverted pulse from a clock. Further pulses are inhibited from passing through the gate by an inhibit signal generated by a toggling flip-flop responsively to the trailing edge of the gate output pulse. The leading edge of the gate output pulse is used to reset the counter to zero, to start the integrating process and to open a gate to pass clock pulses to the counter, all substantially coincident with the first negative transition of a clock pulse following the setting of the cycle flip-flop to its logical one state.

24 Claims, 3 Drawing Figures

INVENTOR.
Alexander B. Cannara
BY
Marshall J. Breen
ATTORNEY

WITNESS
William Martin Jr.

PATENTED OCT 24 1972 3,701,142

INVENTOR.
Alexander B. Cannara
BY
ATTORNEY

WITNESS

INTEGRATING CONVERTERS WITH SYNCHRONOUS STARTING

BACKGROUND OF THE INVENTION

Prior art electronic measurement devices are known in which a digital display of input data is obtained by converting the input signal to a time interval and measuring that time interval digitally in terms of a standard pulse frequency. The number of pulses counted from the beginning to the end of the time interval can be stored and displayed as a digital representation of the analog input signal. An uncertainty arises, however, because the ultimate conversion resolution corresponds to one pulse interval. In addition, the beginning of the time interval and the pulse train are not synchronized so that any given total of counted pulses may be as much as one pulse interval greater or less than the true length of the time interval being measured.

An example of a device of the above type is shown and described in the Ammann U.S. Pat. No. 3,316,547. This is a dual-slope integrating voltmeter. It performs a measurement by allowing the D.C. input voltage to charge up a capacitor, or integrator, for a known time determined by a known number of pulses from a pulse generator or clock. At the end of this time period as measured by the counter, the input is switched to a known reference voltage of opposite polarity which discharges the capacitor to its initial state which may conveniently be zero charge. The time required to do this is measured by a decade counter which counts the pulses during the discharge time from the same pulse generator used to establish the charging time interval. The total count assembled during the discharge interval is proportional to the input voltage and is displayed on a digital readout. It will be seen that the device of the Ammann patent begins a measurement at the random discretion of the control circuit by clearing the counter and, at the same instant, connecting the input voltage to the integrator. Since there is no synchronization of the clock to this starting instant, the phase of its output will be random and the counter indication may not be a true measure of the time interval. Thus ($n$) counts may be totalled in less than ($n$) full pulse periods and this error may be almost one full period. When the counter reaches ($n$) counts, the control in less than one pulse period, switches the integrator to the reference and clears the counter so that the discharge interval can be measured. However, since the charging interval may already be too short by as much as one pulse period, the integrator may not charge up quite as far as it should have. Thus, even if the discharge interval is measured with zero error, the final displayed count can be as much as one count too low. This error adversely affects the accuracy of the device and is particularly large when the integrating time is made small for fast readout.

SUMMARY OF THE INVENTION

It is a general object of this invention to improve the accuracy of measuring instruments which employ digital counters to measure a time interval.

It is a specific object of this invention to overcome the inherent timing inaccuracies of the prior art dual-slope integrating measuring devices as described above.

In attaining the objects of this invention, circuit means are provided for making the start of the integrating process synchronous with the beginning of a clock pulse. This is accomplished by a circuit which generates a single clear pulse synchronized with the first high-to-low transition of a clock pulse after a cycle flip-flop is set to a start position. The leading edge of the clear pulse is used to clear the counter, open the counter gate and to connect the input voltage to the integrator. The counter responds to the first high-to-low transition of the clock pulse after the counter gate is opened and thus will register its first count one full clock period after the input voltage is connected to the integrator. In this manner the start is synchronous with the clock.

DESCRIPTION OF THE INVENTION

Figure 1:
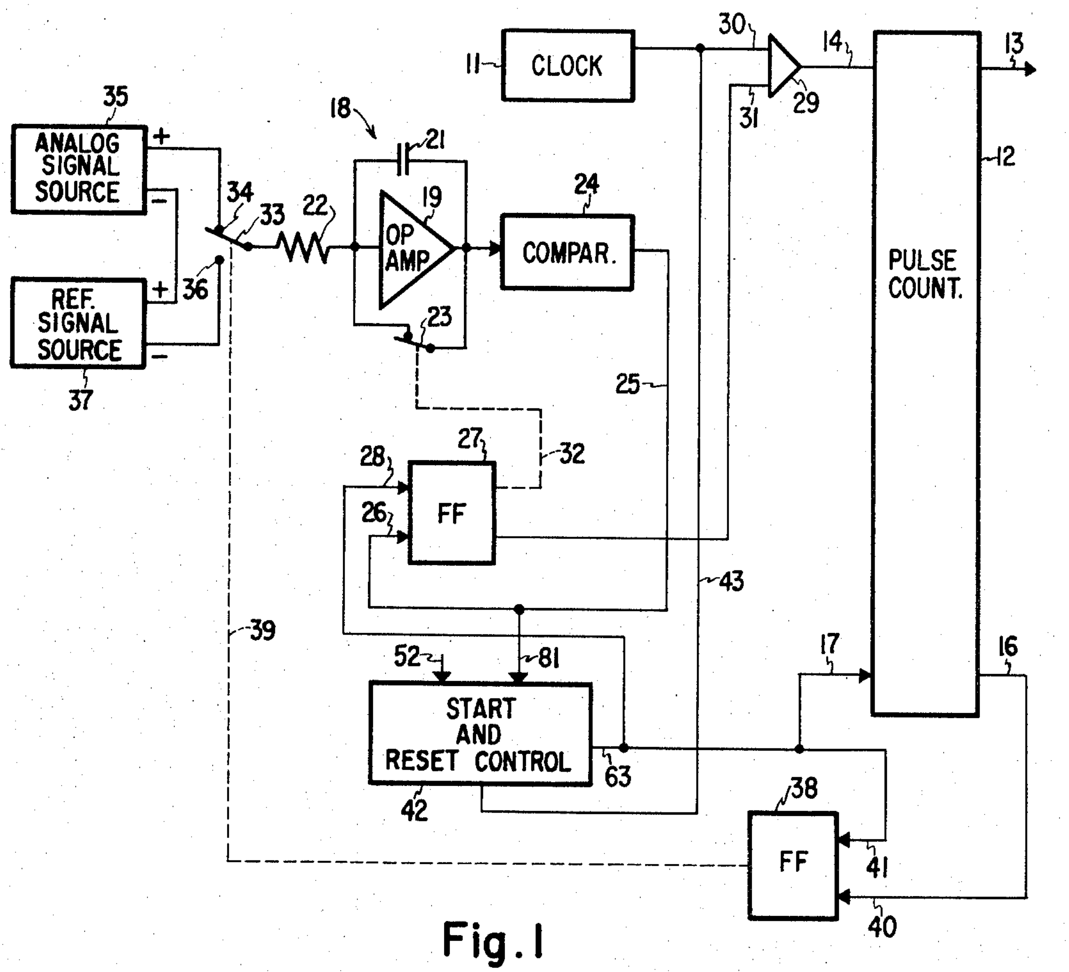
FIG. 1 is a block diagram of a preferred embodiment of an integrating analog-to-digital converter in accordance with the invention.

Referring now to FIG. 1, a preferred embodiment of a dual-slope integrating measuring device of the type briefly outlined hereinbefore will include a conventional pulse generator or clock 11 for generating a series of pulses having time separations equal to the pulse width or a 50 percent duty cycle. A pulse counter 12 of conventional type is provided which produces a digital output as generally indicated as 13. This may be a visual display or an electrical binary output representation of the number of pulses applied to its input 14 from the clock 11. A full-scale or overflow output 16 is provided at which a pulse is generated in response to a full scale count being registered at output 13. The counter includes a reset input 17 such that, in response to a pulse applied to 17, the counter 12 is reset to zero for starting.

The transmission of pulses from the block 11 to the pulse counter 12 is controlled by a starting pulse and by the output of an integrating circuit 18 as will later be described. The integrating circuit is conventional and comprises an operational amplifier 19 having a feedback capacitor 21 connected between its output and input and a resistor 22 connected in series with its input. As is well known, the output signal from such an integrating circuit is proportional to the time integral of the input signal applied thereto over a given time period. In order to control the integrating time, a switch 23 is provided which when closed, as shown, provides a short circuit path around the capacitor 21 so that it cannot be charged and no output can be obtained even though a signal is applied to the input. However, when switch 23 is opened the capacitor 21 can be charged and an output signal appears which is the time integral of the input signal.

A zero level comparator 24 coupled to the output of the integrator 18 is arranged to generate a pulse on line 25 when the output from 18 is decreasing and goes to zero level. This pulse triggers the reset input 26 of flip-flop 27. A set input 28 of flip-flop 27 is connected to receive a trigger pulse generated by a start and reset control means 42 as will be latter described in detail.

A two-input AND gate 29 receives clock pulses on input 30 and enable and inhibit signals on input 31 from the output of flip-flop 27. The output of flip-flop 27 also determines the closing and opening of switch 23 as indicated by the dashed line 32.

A switch 33 is selectively operable through contact 34 to connect an unknown analog signal of one polarity from source 35 to the input of integrator 18 or through contact 36 to connect a reference signal of opposite polarity from source 37 to the input of integrator 18. The switch 33 operates responsively to the output of flip-flop 38 as indicated by the dashed line 39. The flip-flop 38 has a set input 40 connected to the overflow output 16 of counter 12 and a reset input 41 energized from the start and reset control circuit 42 as will later be described in detail. In the reset state of flip-flop 38, which is effected responsively to a signal applied to reset input 41, the switch 33 is responsively positioned to connect terminal 34 to the integrator input and thereby apply the signal from the analog source 35. In the set state of flip-flop 38, which is effected responsively to a signal applied to the set input 40 from the overflow output 16, switch 33 is responsively positioned to connect terminal 36 to the integrator input and thereby apply the signal from the reference source 37.

Figure 2:
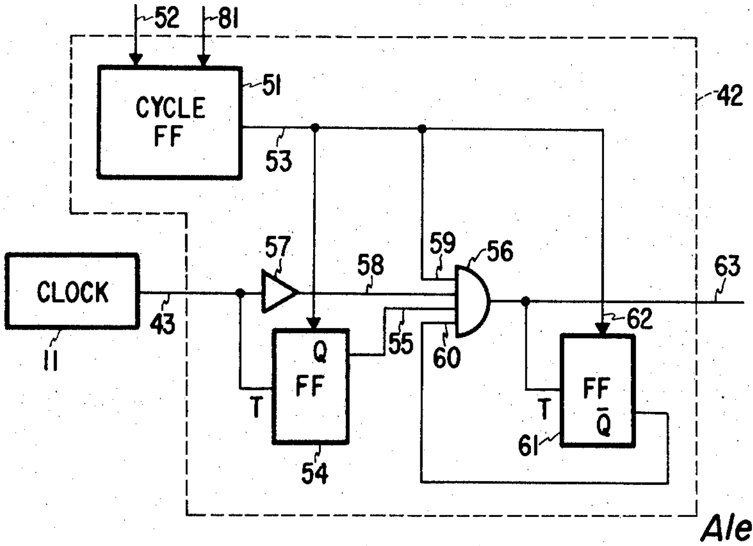
FIG. 2 is a block diagram illustrating specific circuit means for providing synchronous starting for the converter of FIG. 1.
Figure 3:
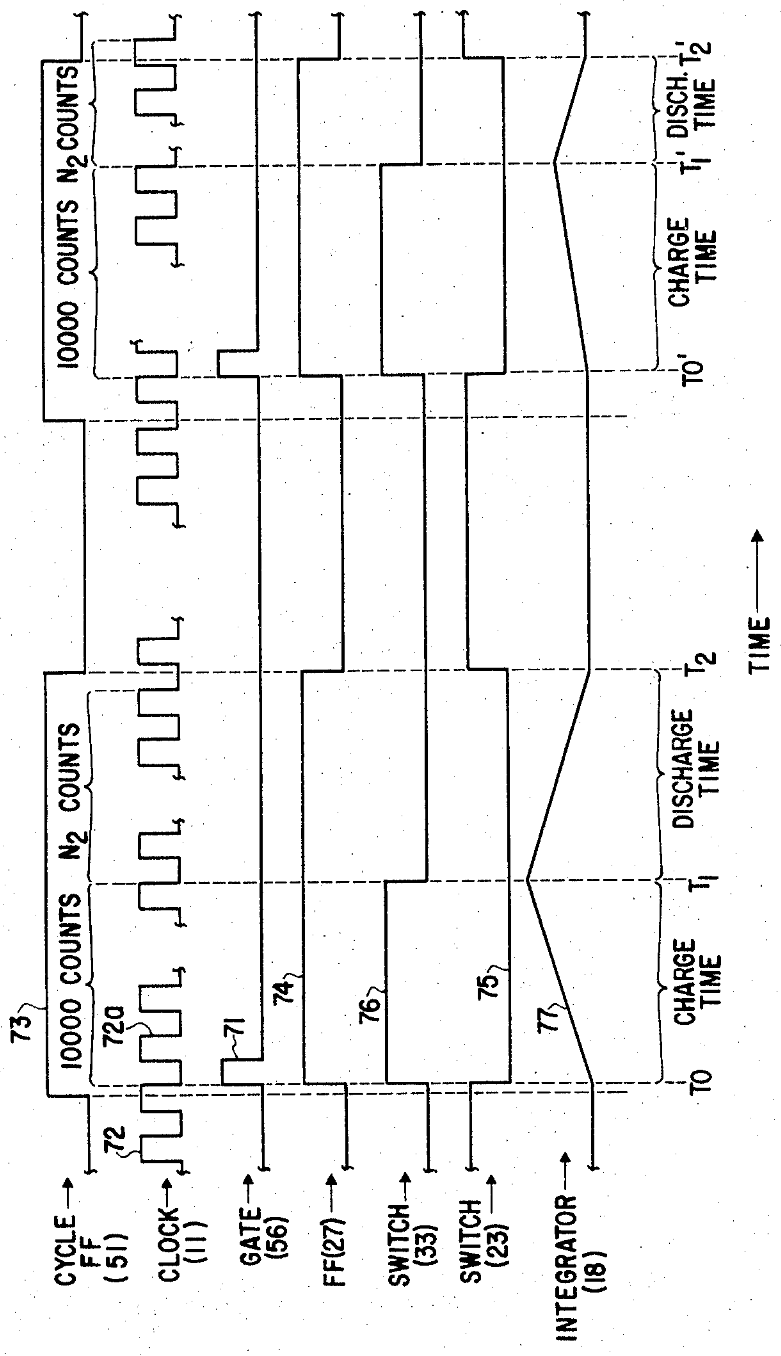
FIG. 3 is a graphical representation of waveforms at various points of the circuits of FIGS. 1 and 2.

Comparison of FIG. 1 of the present invention with FIGS. 1 and 2 of the above mentioned Ammann U.S. Pat. No. 3,316,547 will reveal obvious similarities. It is to be particularly noted, however, that the circuit of Ammann does not provide any connection between the clock and the start and reset control means, such as is specifically shown as line 43 in the FIG. 1 embodiment of the present invention. The pulse 47 of Ammann FIG. 3, is a purely random pulse and the starting time $T_o$ bears no specific relation to the clock pulse 51. The significance of this is that the Ammann patent does not disclose any means for specifically starting a measurement synchronously with the clock pulse and therefore any device built in accordance therewith will have an inherent error in measurement as discussed in detail above.

Referring now to FIG. 2, there will be described in detail a start and reset control means 42 which provides means for starting a measurement synchronously with the clock pulse so that the first integrating time interval is precisely determined by the number of counts registered and the inherent error existing in prior art devices referred to above will be eliminated.

A cycle flip-flop 51 is controlled by a manual start command input signal applied randomly at 52 to cause its output on line 53 to go high. This high signal is applied to the present input of a flip-flop 54 so that the next negative transition of a clock pulse from 11 on line 43 toggles flip-flop 54 to produce a high signal on input 55 to AND gate 56. At the same time, the clock pulse is inverted by inverter 57 and input 58 goes high. Input 59 is already high and input 60 from the $\overline{Q}$ output of flip-flop 61 is high because of the high signal at preset input 62. Thus the AND gate 56 passes the inverted clock pulse to line 63. The trailing edge of the pulse from gate 56 toggles off flip-flop 61 and Q goes to zero and inhibits any further clock pulses from passing through gate 56 to line 63.

The result is illustrated by the waveforms of FIG. 3 wherein a single inverted clock pulse 71 is produced at the output of gate 56 on line 63 and is synchronized with the first negative transition of the clock pulse 72 after the cycle flip-flop 51 output signal 73 went high. The leading edge of the control pulse 71 on line 63 clears the counter to zero by connection at 17. It also resets flip-flop 38 to actuate switch 33 to connect the analog signal to the integrator 18. At the same time, the leading edge of control pulse 71 applied to the set input 28 of flip-flop 27 actuates switch 23 to open position to start the integration process and provides an enable signal to input 31 of gate 29 to open the gate to permit clock pulses applied to 30 to pass through and be registered in the pulse counter 12. The first negative transition **72*a* of a clock pulse after the leading edge of control pulse 71** will register one complete count in the counter and the time elapsed between the start of the integration process at $T_o$ and the registration of one count is precisely the time interval for one complete clock pulse and thus no timing error exists, as would be the case for random starting.

Waveform 74 represents the output signal of flip-flop 27 which is connected to the input 31 of gate 29. When this signal 74 is high, it enables 29 to pass the clock pulses 72 to the counter 12 and when it goes low it closes gate 29 and inhibits further clock pulses from passing through. Waveform 75 represents the position of switch 23 responsively to the output 74 of flip-flop 27 and when this waveform 75 is low, switch 23 is open and when this waveform is high, switch 23 is closed. Waveform 76 represents the position of switch 33 responsively to the output of flip-flop 38 and when this waveform is high, the analog signal source 35 is connected to the input of integrator 18, and when this waveform is low, the reference signal source 37 is connected to the integrator 18. Waveform 77 represents the output of the integrator 18 on line 25 which shows the familiar dual-slope characteristic of this type of converter.

Thus far it has been shown that a synchronous start has been made at time $T_o$. The integration continues as indicated by the positive slope output 77 of the integrator 18 until $T_1$ is reached at which the counter 12 has counted say 10,000 counts, overflows, resets automatically to 0000 and produces a signal output at 16 which acts on the set input 40 of flip-flop 38 to change its state and actuate switch 33 to connect the reference signal source 37 to the integrator 18 as indicated by the waveform 76. The counter 12, which has been automatically reset to zero at $T_1$ now continues to count clock pulses 72 starting from $T_1$ but the integration process is now reversed and produces the negative slope of the waveform 77. At $T_2$ the waveform 77 reaches zero and the comparator 24 produces a pulse on line 25 which, applied to the reset input 26 of flip-flop 27, causes it to change state. Its output 74 goes low as seen in FIG. 3 and is applied to input 31 of gate 29 as an inhibit signal to close the gate 29 and prevent further clock pulses 72 from being counted. At the same time, switch 23 is closed responsively to the change in state as indicated by waveform 75 and the integrator 18 is reset to zero.

The reset signal from the comparator 24 also is applied on line 81 to reset the cycle flip-flop 51 to produce a logical zero on line 53 and the system has been completely reset to the condition in which it was found just prior to time $T_o$. No further measurement can be made until the cycle flip-flop 51 is again set manually or automatically to produce a logical one on line 53 and the operation described above is repeated.

It will be particularly noted that at $T_2$, the signal 74 on input 31 of AND gate 29 went low while the clock pulse 72 was already low. Thus the high to low transition of the signal 74 will not be counted by counter 12 and the time error in the readout at 13 will be less than one-half clock pulse periods as indicated by the bracket marked "$N_2$ Counts" in FIG. 3.

A second complete integration process from $T_o'$ to $T_2'$ is indicated in FIG. 3 and corresponds to an analog signal one-half as large as that for the first process from $T_o$ to $T_2$. It will be noted that at $T_2'$, the signal 74 on input 31 went low while the clock pulse 72 was high. Thus, due to the logical AND function of gate 29, the high to low transition of the signal 74 at $T_2'$ will be counted by the counter 12 and again the time error will be less than one-half clock pulse periods as indicated by the bracket marked "$N_2'$ Counts". Thus the discharge time periods as measured by the counter 12, will always be accurate to within plus or minus one-half pulse period due to the AND gate 29 and a 50 percent duty-cycle clock pulse. The charge time, determined by the counter 12, will be substantially free from error due to synchronous starting as described above. The only other errors possibly affecting the measuring accuracy of this system relate to the stability of the reference voltage source and the stability of the operational amplifier which, in any case, are not affected by the attributes of this invention.

It will be apparent from the above that, in accordance with this invention, three factors are necessary in attaining the maximum resolution and accuracy where a digital counter is used to measure time. These are (1) synchronous starting, (2) a 50 percent duty-cycle clock pulse, and (3) proper gating of the clock pulses to the counter.

While the invention has been described by means of a specific embodiment, it is not intended to be limited thereto, and obvious modifications will occur to those skilled in the art without departing from the spirit and scope of the invention.

Having thus set forth the nature of the invention, what is claimed herein is:

1. In an integrating converter having a clock for generating a timing signal characterized by successive clock pulses, means for generating a starting control pulse synchronized with a clock pulse in response to a random start signal, comprising:

a. signal gating means,
b. means for applying said timing signal to said signal gating means,
c. means actuated by said random start signal for enabling said signal gating means in response to a first clock pulse to pass the first clock pulse to provide said starting control pulse, and
d. means actuated by said random start signal for inhibiting said signal gating means in response to said starting control pulse to inhibit any further clock pulses from passing through said signal gating means.

2. The apparatus defined in claim 1 wherein said means for enabling said signal gating means comprises:

a. a flip-flop circuit having preset and toggle input terminals for producing a gate enabling signal in response to the signal applied to said toggle input terminal when preset by the signal applied to said preset terminal,
b. means for applying said random start signal to said preset input terminal,
c. means for applying said timing signal to said toggle input terminal, and
d. means for applying said gate enabling signal to said signal gating means.

3. The apparatus defined in claim 1 wherein said means for inhibiting said signal gating means comprises:

a. a flip-flop circuit having preset and toggle input terminals for producing a gate inhibiting signal in response to the signal applied to said toggle input terminal when preset by the signal applied to said preset input terminal,
b. means for applying said random start signal to said preset input terminal,
c. means for applying said control pulse passed by said signal gating means to said toggle input terminal, and
d. means for applying said gate inhibiting signal to said signal gating means.

4. In an integrating converter having pulse timing means, integrating means and digital counting means, means for generating a starting control pulse synchronized with a timing pulse, comprising:

a. a clock for generating clock pulses having a 50 percent duty cycle,
b. a first flip-flop controlled by a random input signal to provide a logical one output signal,
c. a second flip-flop preset by said first flip-flop and controlled by said clock,
d. an AND gate having three inputs connected to receive respectively an inverted clock signal, and the outputs of the first and second flip-flops,
e. a third flip-flop preset by said first flip-flop and controlled by the output of said AND gate, and
f. means connecting the output of said third flip-flop to a fourth input of said AND gate to provide an inhibit signal thereto.

5. In an integrating converter having a clock, an analog signal integrator and a digital counter, means for starting the analog signal integrator and the digital counter in synchronization with said clock to improve the accuracy of the converter comprising:

a. a clock for generating clock pulses,
b. means actuated responsively to a random start signal to generate a control signal synchronous with a clock pulse,
c. means actuated responsively to the control signal for resetting the counter,
d. gate means opened responsively to the control signal for passing clock pulses to the counter, and
e. means actuated responsively to the control signal for enabling the integrator to begin the integration process.

6. The apparatus defined in claim 5 wherein said means actuated responsively to a random start signal to generate a control signal comprises:

a. signal gating means
b. means for applying a signal representative of the clock pulses to said signal gating means, c. means actuated by the random start signal for enabling the signal gating means in response to a first clock pulse to pass the signal representative of the clock pulses to provide the control signal, and d. means actuated by the random start signal for inhibiting the signal gating means in response to the control signal.

7. The apparatus defined in claim 6 wherein said means for enabling the signal gating means comprises:

a. a flip-flop circuit having preset and toggle input terminals for producing a gate enabling signal in response to the signal applied to the toggle input terminal when preset by the signal applied to the preset input terminal, b. means for applying the random start signal to the preset input terminal, c. means for applying the clock pulses to the toggle input terminal, and d. means for applying the gate enabling signal to the signal gating means.

8. The apparatus defined in claim 7 wherein said flip-flop circuit is responsive to the trailing edge of a pulse in the signal applied to said toggle input terminal.

9. The apparatus defined in claim 6 wherein said means for inhibiting the signal gating means comprises:

a. a flip-flop circuit having preset and toggle input terminals for producing a gate inhibiting signal in response to the signal applied to the toggle input terminal when preset by the signal applied to the preset input terminal, b. means for applying the random start signal to the preset input terminal, c. means for applying the control signal passed by the signal gating means to the toggle input terminal, and d. means for applying the gate inhibiting signal to the signal gating means.

10. The apparatus defined in claim 9 wherein said flip-flop circuit is responsive to the trailing edge of a pulse in the signal applied to said toggle input terminal.

11. The apparatus defined in claim 5 wherein said means actuated responsively to a random start signal to generate a control signal comprises:

a. signal gating means, b. signal inverter means for applying a signal representative of the logical inverse of the clock pulses to said signal gating means, c. means actuated by the random start signal for enabling the signal gating means in response to a first clock pulse to pass the inverted clock pulse signal to provide the control signal, and d. means actuated by the random start signal for inhibiting the signal gating means in response to the control signal to prevent any further inverted clock pulses from passing through said signal gating means.

12. The apparatus defined in claim 11 wherein said means for enabling the signal gating means comprises:

a. a flip-flop circuit having preset and toggle input terminals for producing a gate enabling signal in response to the trailing edge of a signal pulse applied to the toggle input terminal when preset by the signal applied to the preset input terminal, b. means for applying the random start signal to the preset input terminal, c. means for applying the clock pulses to the toggle input terminal, and d. means for applying the gate enabling signal to the signal gating means.

13. The apparatus defined in claim 11 wherein said means for inhibiting the signal gating means comprises:

a. a flip-flop circuit having preset and toggle input terminals for producing a gate inhibiting signal in response to the trailing edge of a signal pulse applied to the toggle input terminal when preset by the signal applied to the preset input terminal, b. means for applying the random start signal to the preset input terminal, c. means for applying the control pulse passed by the signal gating means to the toggle input terminal, and d. means for applying the gate inhibiting signal to the signal gating means.

14. In an integrating converter having a clock for generating clock pulses, an analog signal integrator and a digital counter, means for providing synchronous starting of the integration process to improve the accuracy of the converter comprising:

a. signal gating means for selectively applying said clock pulses to said counter, b. a flip-flop having an input and an output, c. means for randomly applying a start signal to said input to establish a logical one signal at said output, d. gate means actuated responsively to said logical output signal to pass a clock pulse to an output line to provide a control pulse, e. means actuated responsively to the trailing edge of said control pulse to inhibit passage of further clock pulses to the output line, and f. means actuated responsively to the leading edge of the control pulse for enabling said integrator and said signal gating means in synchronization with said clock.

15. The apparatus defined in claim 14 wherein said means for enabling said integrator and said signal gating means in synchronization with said clock simultaneously enables said integrator and said signal gating means.

16. The apparatus defined in claim 14 further comprising means actuated responsively to the leading edge of the control pulse for resetting said counter.

17. In an integrating converter having a clock for generating a timing signal characterized by successive clock pulses, means for generating a starting control pulse synchronized with a clock pulse in response to a random start signal, comprising:

a. signal gating means, b. signal inverter means for applying a signal representative of the logical inverse of said timing signal to said signal gating means, c. means actuated by said random start signal for enabling said signal gating means in response to a first clock pulse to pass the first inverted clock pulse to provide said starting control pulse, and d. means actuated by said random start signal for inhibiting said signal gating means in response to said starting control pulse to inhibit any further clock pulses from passing through said gate.

18. The apparatus defined in claim 17 wherein said means for enabling said signal gating means comprises:

a. a flip-flop circuit having preset and toggle input terminals for producing a gate enabling signal in response to the signal applied to said toggle input terminal when preset by the signal applied to said preset terminal, b. means for applying said random start signal to said preset input terminal, c. means for applying said timing signal to said toggle input terminal, and d. means for applying said gate enabling signal to said signal gating means.

19. The apparatus defined in claim 18 wherein said flip-flop circuit is responsive to the trailing edge of a pulse in the signal applied to said toggle input terminal.

20. The apparatus defined in claim 17 wherein said means for inhibiting said signal gating means comprises:

a. a flip-flop circuit having preset and toggle input terminals for producing a gate inhibiting signal in response to the signal applied to said toggle input terminal when preset by the signal applied to said preset input terminal, b. means for applying said random start signal to said preset input terminal, c. means for applying said control pulse passed by said signal gating means to said toggle input terminal, and d. means for applying said gate inhibiting signal to said signal gating means.

21. The apparatus defined in claim 20 wherein said flip-flop circuit is responsive to the trailing edge of a pulse in the signal applied to said toggle input terminal.

22. In an integrating converter having a clock for generating clock pulses, an analog signal integrator and a digital counter, apparatus for improving the accuracy of said converter comprising:

a. switching means for selectively enabling said analog signal integrator, b. signal gating means for selectively applying said clock pulses to said counter, c. means responsive to a random starting signal for generating a control pulse synchronized with a clock pulse, and d. means responsive to the leading edge of said control pulse for enabling said switching means and said signal gating means to start said analog signal integrator and said digital counter simultaneously and in synchronization with said clock.

23. The apparatus defined in claim 22 further comprising means responsive to the leading edge of said control pulse for resetting said counter.

24. Apparatus for digitally timing an analog signal process comprising:

a. a block for producing a timing signal alternating between first and second logical levels for substantially equal time intervals, b. signal gating means responsive to said timing signal for producing an output signal having the logical level of said timing signal when enabled and having said first logical level when disabled, c. counting means responsive to the output signal of said signal gating means for counting changes in the level of said output signal from said second logical level to said first logical level, d. means responsive to a random start signal for generating a control pulse synchronous with said timing signal, e. means responsive to said control pulse for simultaneously starting said analog signal process and enabling said signal gating means, and f. means responsive to the completion of said analog signal process for disabling said signal gating means.

* * * * *